United States Patent [19]

Rich

[11] Patent Number: 4,723,652
[45] Date of Patent: Feb. 9, 1988

[54] ACCUMULATOR APPARATUS FOR PRINTED CIRCUIT BOARDS

[76] Inventor: Dennis E. Rich, 2512 W. 12420 South, Riverton, Utah 84065

[21] Appl. No.: 845,013

[22] Filed: Mar. 17, 1986

[51] Int. Cl.$^4$ ............................................. B65G 29/00
[52] U.S. Cl. ............................. 198/803.13; 198/484.1
[58] Field of Search ...................... 198/803.01, 803.13, 198/688.1, 690.2, 484.1

[56] References Cited

U.S. PATENT DOCUMENTS

| | | | |
|---|---|---|---|
| 3,245,518 | 4/1966 | Reibel et al. | 198/803.13 |
| 3,580,388 | 5/1971 | Resener | 198/690.2 |
| 3,737,024 | 6/1973 | Gelzer | 198/803.01 |
| 3,960,264 | 6/1976 | Carbine et al. | 198/803.01 |
| 4,143,759 | 3/1979 | Paradis | 198/690.2 |
| 4,494,456 | 1/1985 | Pink | 198/803.01 |

FOREIGN PATENT DOCUMENTS 3143269  5/1983  Fed. Rep. of Germany ... 198/484.1

*Primary Examiner*—Randolph A. Reese
*Assistant Examiner*—Anthony Knight
*Attorney, Agent, or Firm*—H. Gordon Shields

[57] ABSTRACT

Accumulator apparatus includes an endless belt having a plurality of spaced apart paddles extending outwardly from the belt, and the spaces between the paddles receive printed circuit boards for transporting the circuit boards. The paddles include slots for receiving the belt, and the paddles are spaced apart in accordance with the distance between the grooves in the belt. The grooves in the belt serve a dual purpose, and the dual purpose includes the spacing apart of the paddles and the meshing with gears for moving the belt.

8 Claims, 10 Drawing Figures

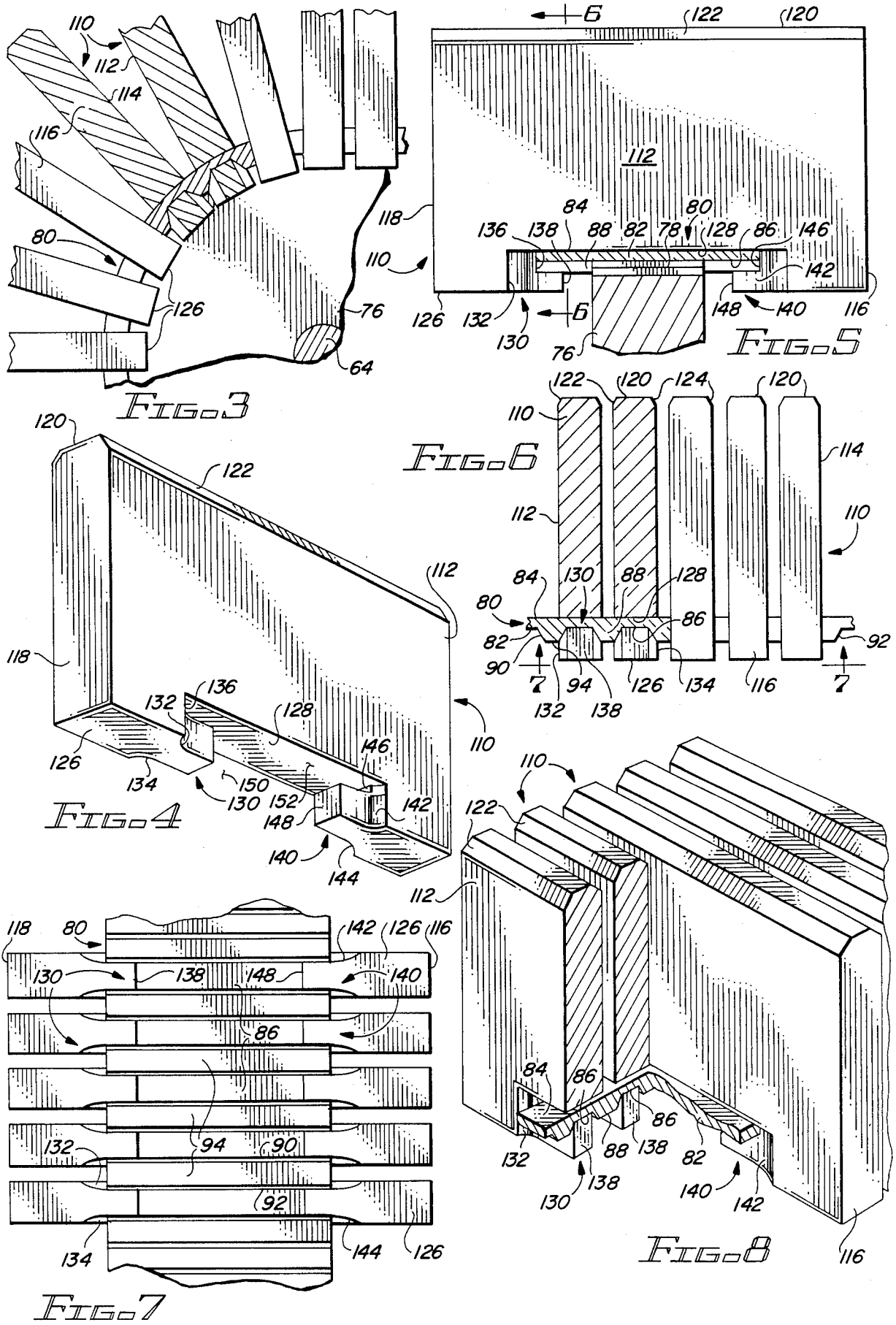

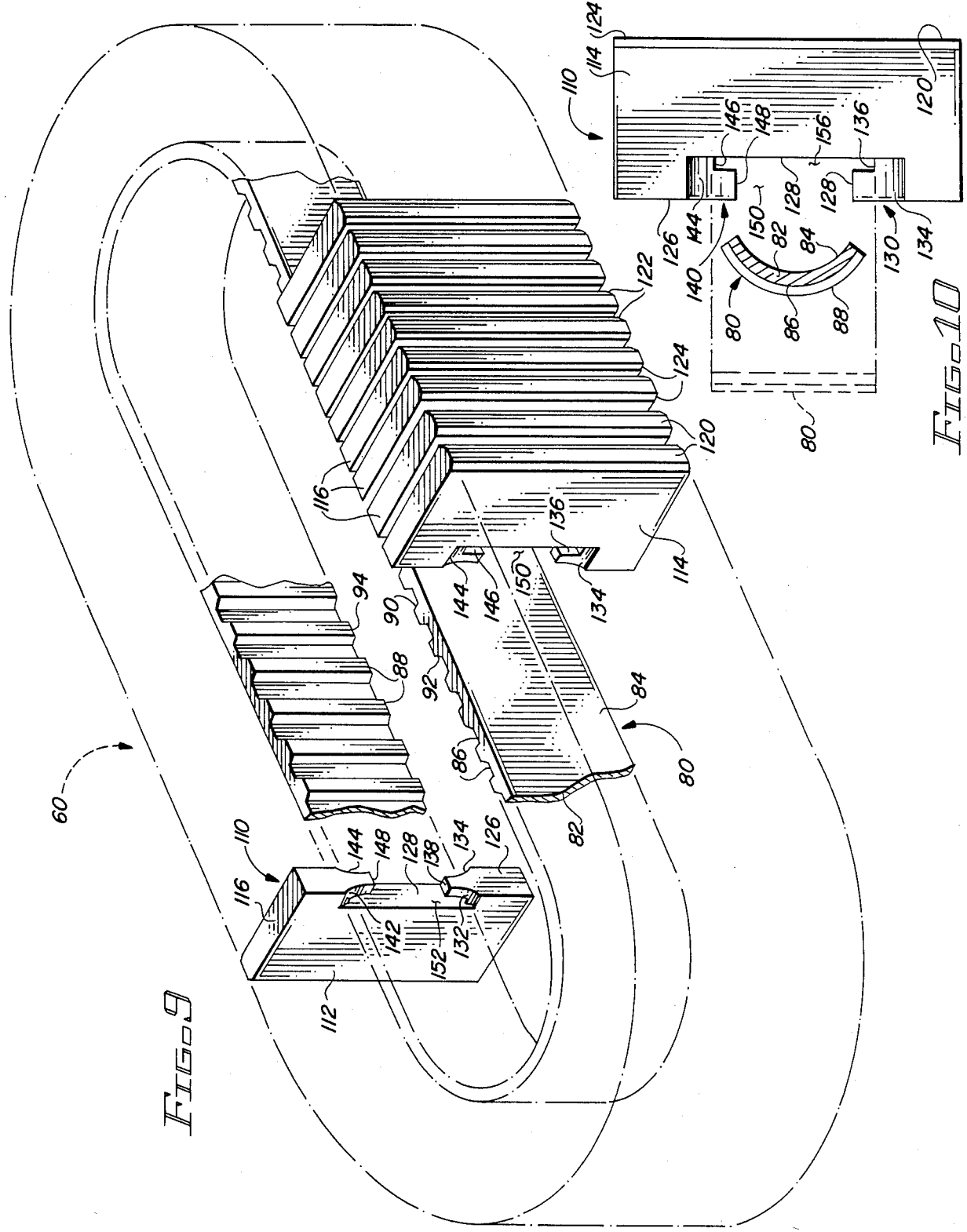

ACCUMULATOR APPARATUS FOR PRINTED CIRCUIT BOARDS

BACKGROUND OF THE INVENTION

1. Field of the Invention

This invention relates to accumulator apparatus for printed circuit boards and, more particularly, to accumulator apparatus for printed circuit boards having an endless belt with paddles secured to the belt and extending outwardly for receiving and transporting printed circuit boards.

2. Description of the Prior Art

Prior art printed circuit board accumulators generally include free-standing units with an endless belt for moving the circuit boards generally horizontally. Paddles secured to the belt are spaced apart for receiving and holding the printed circuit boards as the belt moves. The paddles are generally individually secured, as by screws, rivets, etc., to the belt.

The accumulators may be used as either feeder elements or collector elements for processing circuit boards, or for a delay in the processing of the boards. An accumulator may receive the printed circuit boards and transport them for storage or for feeding onto a conveyor, to a stacker, etc. The boards, when the apparatus is used as a feeder, may be placed manually on the conveyor belt, and the printed circuit boards may be discharged from the accumulator onto a conveyor of some type. Since an accumulator belt is motor driven, the motor may typically be operable at a speed corresponding to the conveyor system with which the accumulator is matched.

As a collector, the accumulator may automatically receive printed circuit boards from a conveyor by having the circuit boards fed into the space between adjacent paddles and the boards may then be manually removed from the accumulator. Again, the motor operating the apparatus, or causing the belt to move, may be set in accordance with the parameters of the mating equipment. A proximity switch and/or a photo sensor may be used to start and to stop the motor.

One of the inherent problems of the prior art is the means of securing the paddles to a belt. When paddles are riveted to the belt, time is expended in the individual operations required for riveting each paddle. In addition, the cost of the apparatus increases in accordance with the complexity of the assembly and manufacturing process. With either rivets or screws or the like, a substantial amount of hand work is involved which increases the time and expense involved in manufacturing the apparatus.

With the apparatus of the present invention, slots in the paddle receive the timing belt so that a direct securement by means of a mechanical element, such as a screw or a rivet, is obviated. the assembly time, and the corresponding cost of the apparatus, is substantially reduced.

SUMMARY OF THE INVENTION

The invention described and claimed herein comprises an accumulator for printed circuit boards including a gear belt having a plurality of teeth with slots between the teeth for meshing with the teeth on gears, and a plurality of paddles is secured to the belt at the grooves. The paddles include slots which receive the belt for securing the paddles to the belt.

Among the objects of the present invention are the following:

To provide new and useful accumulator apparatus;

To provide new and useful printed circuit board accumulator apparatus;

To provide new and useful accumulator apparatus for transporting printed circuit boards;

To provide new and useful accumulator apparatus including a plurality of paddles secured to a timing belt;

To provide new and useful apparatus for transporting circuit boards;

To provide new and useful belt apparatus having a plurality of teeth spaced apart by grooves and a plurality of paddles includes slots for receiving portions of the timing belt; and To provide new and useful method for assemblying a plurality of paddles to a belt.

BRIEF DESCRIPTION OF THE DRAWING

FIG. 3 is a side view of a portion of the apparatus of the present invention taken generally from circle 3 of FIG. 2.

FIG. 4 is a perspective view of a portion of the apparatus of the present invention.

FIG. 5 is a view in partial section taken generally along line 5—5 of FIG. 2.

FIG. 6 is a view in partial section taken generally along line 6—6 of FIG. 5.

FIG. 7 is a bottom view taken generally along line 7—7 of FIG. 6.

FIG. 8 is a perspective view of a portion of the apparatus of the present invention.

FIG. 9 is a perspective view illustrating a portion of the apparatus of the present invention.

FIG. 10 is a side view illustrating the assembly of the apparatus shown in FIG. 9.

DESCRIPTION OF THE PREFERRED EMBODIMENT

Figure 1:
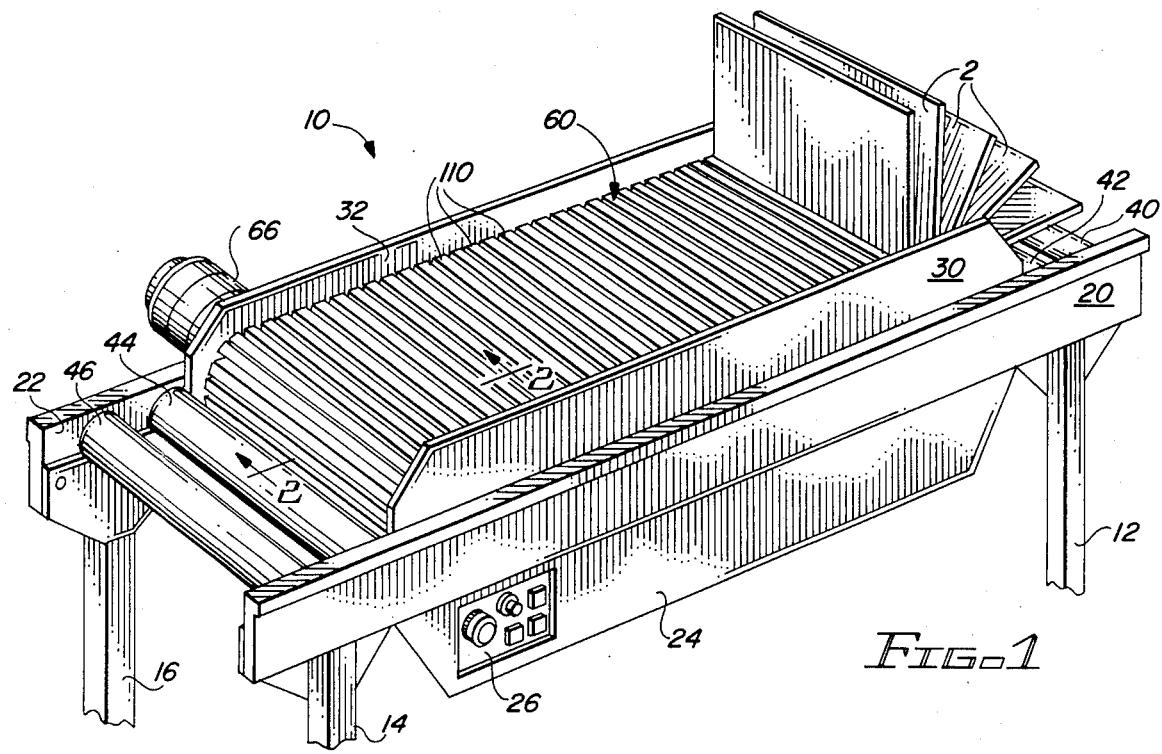
FIG. 1 is a perspective view of the apparatus of the present invention.

FIG. 1 is a perspective view of printed circuit board accumulator apparatus 10 of the present invention. The printed circuit board accumulator apparatus 10 includes four telescoping legs for height adjustment. Portions of three legs 12, 14, and 16 are shown in FIG. 1.

A pair of side panels 20 and 22 are spaced apart from each other and are secured to and supported by the legs. The panel 20 is secured to the legs 12 and 14. The panel 22 is secured to the leg 16 and to a fourth leg, not shown. Extending downwardly from the side panel 20 is a lower panel 24. A control panel 26 is, in turn, appropriately secured to the lower panel 24. The control panel 24 includes a plurality of appropriate electrical switches for controlling the accumulator apparatus 10. Upwardly extending panels 30 and 32 are secured to the side panels 20 and 22, respectively.

Extending between the side panels 20 and 22, and appropriately secured thereto is a belt and transport assembly 60. At each end of the belt and transport assembly 60, and extending between and appropriately secured to the side panels 20 and 22, and journaled for rotation, are a plurality of rollers. A pair of rollers 40 and 42 are shown at one end of the belt and transport assembly 60, and a pair of rollers 44 and 46 are shown at the other end of the belt and transport assembly 60. The belt and transport assembly 60 is shown in more detail in FIGS. 2-10 of the drawing.

The purpose of the accumulator apparatus 10 is for accumulating circuit boards, and a plurality of circuit boards 2 are shown in FIG. 1 secured to the belt and transport assembly 60 of the apparatus 10.

Figure 2:
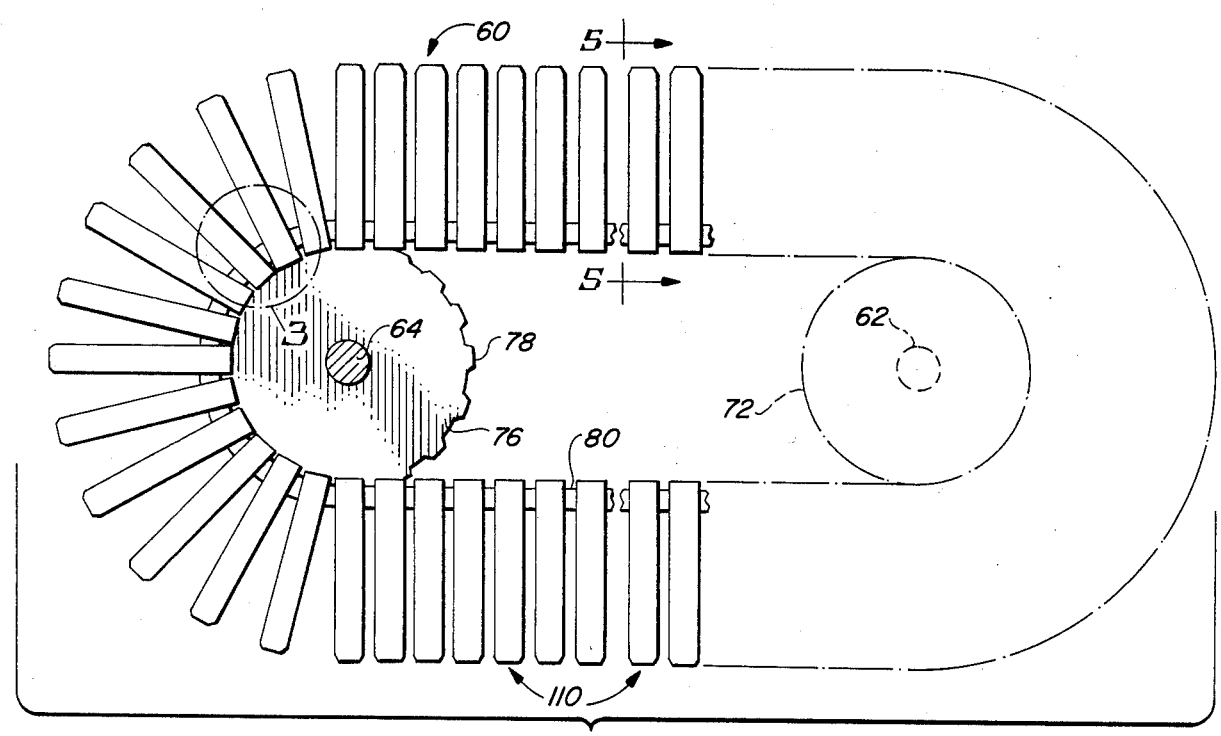
FIG. 2 is a side view of a portion of the apparatus of the present invention.

FIG. 2 is a side view of the belt and transport assembly 60, removed from its supporting structure, including the side plates or panels 20 and 22. The belt apparatus 60 is secured to the side panels 20 and 22 by a pair of rotatable shafts 62 and 64. The shafts 62 and 64 are appropriately journaled for rotation between the side panels 20 and 22. In turn, a pair of toothed gear wheels or sprockets 72 and 76 are secured to the shafts 62 and 64, respectively. The shaft 62 and the sprocket 72 are shown in phantom in FIG. 2.

A timing belt 80 is disposed about the gears or sprockets 72 and 76. The gears or sprockets 72 and 76 rotate in response to rotation of the shaft 64 by a motor 66. The motor 66 is shown in FIG. 1 extending outwardly from the side panel 22. The shaft 64 is appropriately secured to the output shaft of the motor 66.

The gear or sprocket 76 includes a plurality of spaced apart teeth 78, and the gear or sprocket 72 also includes a plurality of spaced apart teeth, not shown. The teeth of the sprockets mesh with appropriate and matching slots in the timing belt 80.

Secured to the timing belt 80 are a plurality of paddles 110. The paddles 110 extend outwardly from the belt 80, and several circuit boards 2 are shown disposed between adjacent paddles 110.

FIG. 3 an enlarged view taken generally from Circle 3 of FIG. 2, in partial section, illustrating the securing of paddles 110 to the belt 80. FIG. 4 is an enlarged bottom perspective view of a paddle 110. FIG. 5 is is a side view of a portion of the belt and transport assembly 60 taken generally along line 5—5 of FIG. 2, show ing a portion of a tooth 78 of the sprocket 76, a portion of the belt 80, and a paddle 110 secured to the belt 80. The belt 80 is shown meshed with the tooth 78 of the sprocket 76.

FIG. 6 is a view in partial section taken generally along line 6—6 of FIG. 5, showing the securing of a plurality of the paddles 110 to the belt 80. FIG. 7 is a bottom view of the belt 80 and a plurality of paddles 110, taken generally along line 7—7 of FIG. 6. FIG. 8 is a perspective view of the plurality of paddles 110, showing details of the securing of the paddles 110 to the belt 80. The belt 80 and some of the paddles 110 are shown in partial section and partially broken away.

The assembly of the paddles 110 to the belt 80 is illustrated in FIGS. 9 and 10. FIG. 9 is a perspective view of the belt 80 disposed on its side, showing a plurality of the paddles 110 disposed about the belt. FIG. 9 is a side view showing the bending or folding of the belt 80 for insertion of the belt into one of the paddles 110 to secure the paddle to the belt.

For the following discussion on details of the belt assembly 60, particularly the belt 80 and the paddles 110, attention will primarily be directed to FIGS. 2, 3, 4, 5, 6, 7, 8, 9, and 10.

As best shown in FIGS. 5, 6, 7, and 8, the belt 80 is a relatively typically configured timing belt or timing-type belt which includes a base portion 82 and a plurality of spaced apart and parallel teeth 88. The teeth 88 face inwardly. The belt 80 includes a relatively smooth exterior surface 84. The exterior surface 84 comprises the outer surface of the base 82. Between each tooth 88 is a groove 86. The teeth of the sprockets, such as the teeth 78 of the sprocket 76, mate or mesh with the grooves 86 between the teeth 88 to cause the belt 80 to move on the sprockets 72 and 76.

Each tooth 88 includes a pair of sloping side walls 90 and 92 and a land portion 94, with the side walls 90 and 92 sloping outwardly from the land, as best shown in FIGS. 6, 8, and 9. The land portion 94 comprises a smooth outer end of each tooth 88. Essentially, the interior portion of the belt 80 comprises alternating grooves 86 and lands 94. The grooves and lands cooperate to perform two primary functions. The first function is to hold the plurality of paddles 110, and the second function is to cause the belt 80, with the paddles 110 secured thereto, to move on the frame or table defined by the legs 12, 14, 16, etc., and the side panels 20, 24, 30, and 22, 32, etc.

The paddles 110 are generally rectangularly configured elements. They include a pair of generally parallel and spaced apart sides 112 and 114. The ends of the paddles include a pair of side ends 116 and 118 which extend between the sides 112 and 114. There is also a "top" end 120 which is generally smooth and which is generally perpendicular to the sides 112 and 114 and to the ends 116 and 118. Extending from the top or outer end 120 to the sides 112 and 114 are a pair of chamfered faces 122 and 124. The chamfer 122 extends between the top surface 120 and the side 112, and the chamfer 124 extends between the top surface 120 and the side 114.

Each panel 110 includes a pair of bottom surfaces. Both bottom surfaces are generally parallel to each other, and generally parallel to the top surface 120. The bottom surfaces accordingly are substantially perpendicular to the sides 112 and 114 and to the ends 116 and 118. As best shown in FIGS. 4 and 9, there is an outer bottom surface 126 and an inner bottom surface 128. The outer bottom surface 126 extends inwardly, or toward the center of the panel 110, from the side ends 116 and 118. The inner bottom surface 128 is recessed upwardly from the outer surface 126 and inwardly from the inner ends. The outer bottom surface is in two portions, each of which extends inwardly from the side ends.

A pair of inwardly extending finger-like elemenets or arms 130 and 140 extend inwardly beneath the inner bottom surface 128. Each of the elements 130 and 140 include a pair of concaved or scalloped portions which extend inwardly from the side surfaces 112 and 114 of the paddle. As best shown in FIGS. 4, 7, and 9, and as also shown in FIGS. 3, 5, 6, 8, and 10, the concaved or scalloped portions include a concave portion 132 and a concave portion 134 for the arm 130, and a concave portion 142 and a concave portion 144 for the arm 140.

A notch 136 is defined between the arm 130 and the inner bottom surface 128. A notch 146 is defined between the arm 140 and the inner bottom surface 128. The notches 136 and 146 are aligned with each other. The arm 130 terminates in a flat face 138, and the arm 140 terminates in a flat face 148. The faces 138 and 148 comprise or define inner ends of the arms. The ends or surfaces 138 and 148 are generally parallel to each other and are parallel to the side ends 116 and 118 of each paddle 110. The outer bottom surface 126 extends inwardly to comprise also the bottom of the arms 130 and 140.

As best shown in FIGS. 5 and 6, and as also shown in FIGS. 3, 7, and 8, the grooves 86 of the belt 80 extend into the notches 136 and 146, while the sloping side walls or sides 90 and 92 of the teeth 88 extend on either side of the arms 130 and 140, and into the scalloped or concave portions 132, 134 and 142, 144 of the arms 130 and 140, respectively. The teeth 88 are disposed between adjacent paddles 110. the sloping sides 90 and 92 of the teeth 88 allow the paddles 110 to slant away from a parallel relationship as the belt 80 curves around the sprockets. This is best shown in FIG. 3.

The arms 130 and 140 are aligned with each other and are spaced apart from each other. Between the faces or ends 138 and 148 is an opening 150. The opening 150 comprises the outer opening which extends to an inner opening 152 defined within the notches 136 and 146 and above the outer openings 150. FIGS. 4, 9, and 10 best show the openings 150 and 152.

The opening 152 receives the belt 80. The inner bottom surface 128 defines or comprises the top of the opening 152. The smooth exterior surface 84 of the belt 80 is disposed adjacent to the inner bottom surface 128. The minimum thickness portion of the belt 80, adjacent to or above each groove 86, is disposed within the opening 152.

As best shown in FIG. 7, the sides of the arms 130 and 140 adjacent to the inner faces or ends 138 and 148 are generally parallel to each other. The scalloped portions or concave portions 132, 134, and 142, 144 comprise transitions between the sides 112 and 114 of each paddle and the inner parallel side portions of the arms that extend into the grooves 86 of the belt 80. This may also be understood from FIGS. 6 and 8. The width of the portion of the arms 130 and 140 that extends into the grooves is less than the width of the rest of the paddle. The concave or scalloped portions 132, 134 and 142, 144 comprise transition areas between the full width of a paddle and the narrowed width of the arms 130 and 140.

The narrowed, minimum width of the arms 130 and 140 is substantially the same as the minimum width of the grooves 86 of the belt 80. This is best shown in FIGS. 6 and 7.

As best shown in FIG. 5, the notches 136 and 146 are disposed above the relatively smooth or parallel side wall portions of the arms 130 and 140, and inwardly from the concave portions 132, 142 (and 134, 144) of the arms 130 and 140, respectively.

As will be understood, the panels 110 are held securely to the belt 80 in their spaced apart relationship as determined by the spacing between the teeth 88 of the belts 80. The cooperation between the arms 130 and 140 of the paddles 110 and the grooves 86 and the teeth 88 maintain the paddles in their spaced apart orientation.

The securing of the paddles 110 to the belt 80 may best be understood by reference to FIGS. 9 and 10. FIG. 10 is of particular interest in explaining how the paddles 110 are secured to the belt 80.

In FIG. 10, the belt 80 is shown in phantom without paddles. Adjacent to the phantom illustration, the belt 80 is shown folded, with the relatively smooth outer face 84 and the base 82 concavely curved in order to extend into the notches 136 and 146 between the arms 130 and 140. With the belt 80 folded in that manner, the width of the belt is reduced so that the belt may extend through the opening 150 between the inner faces 138 and 148 of the arms 130 and 140, respectively, and on into the opening 152. The smooth outer face 84 may then be disposed against the inner bottom 128 of the paddles 110. The outer portions of the grooves 86 extend into the notches 136 and 146, with the teeth 88 disposed on opposite sides of the arms 130 and 140.

With the belt 80 curved as shown in FIG. 10, the belt extends into the opening 150 between the arms 130 and 140 of the paddle 110 and into the opening 152. When the belt is released from its curved configuration, the belt straightens into the opening 152 and the paddles are locked onto the belt. In actual assembly, a plurality of paddles are spaced apart from each other and the belt 80 is then appropriately curved or bent (or folded) to be inserted through the openings 150 between the arms of the plurality of paddles. Thus, a plurality of paddles may be secured at the same time to a belt.

It will be noted that the paddles 110 are not permanently affixed to a belt as with the prior art. No rivets, screws, etc., are required. Rather, the cooperating configurations of each paddle 110 and the belt 80 are sufficient to secure each paddle to the belt. At the same time, the cooperating configurations of the belt and the paddles maintain the paddles in their proper spacing to receive a circuit board between an adjacent pair of paddles.

The paddles 110 are free to move as the belt 80 flexes as it moves on the sprockets 72 and 76. Obviously, such movement is limited, but the movement is sufficient to relieve or to prevent the strain that may result from a hard securement, such as with a rivet, screw, etc.

While the priniples of the invention have been made clear in illustrative embodiments, there will be immediately obvious to those skilled in the art many modifications of structure, arrangements, proportions, the elements, materials, and components used in the practice of the invention, and otherwise, which are particularly adapted for specific environments and operative requirements without departing from those principles. The appended claims are intended to cover and embrace any and all such modifications, within the limits only of the true spirit and scope of the invention. This specification and the appended claims have been prepared in accordance with the applicable patent laws and the rules promulgated under the authority thereof.

What I claim is:

1. Accumulator apparatus for accumulating printed circuit boards, comprising, in combination:
   table means;
   belt means movably secured to the table means, including
      a plurality of teeth, and
      a plurality of grooves alternating with the teeth;
   paddle means secured to the belt means, including a plurality of generally rectangular paddles, each of which is secured to a groove between a pair of teeth of the belt means, and each paddle includes notch means, and the belt means extends into the notched means to secure each paddle to the belt means, and each paddle further includes
   a first arm having a first and a second concave portion for contacting the teeth of the belt means, and
   a second arm spaced apart from and aligned with the first arm and having a third and a fourth concave portion contacting the teeth of the belt means, and the notch means is disposed adjacent to the first and second arms.

2. The apparatus of claim 1 in which the notch means includes a first notch disposed adjacent to the first arm and a second notch disposed adjacent to the second arm.

3. The apparatus of claim 2 in which the first and second arms extend into a groove of the belt means.

4. The apparatus of claim 1 in which each paddle further includes an outer opening between the first and second arms and an inner opening adjacent to the outer opening.

5. The apparatus of claim 4 in which the inner opening includes the notch means, and the belt means extends into the inner opening.

6. The apparatus of claim 1 in which the width of a paddle is reduced at the first and second arms.

7. The apparatus of claim 6 in which the belt means includes a base, and each tooth of the belt means includes a land and an outwardly sloping wall on each side of the land, and the sloping walls extend to the base to define the minimum width of each groove.

8. The apparatus of claim 6 in which the width of the first and second arms is substantially the same as the minimum width of a groove of the belt means.

* * * * *